(12) United States Patent
Kim et al.

(10) Patent No.: US 9,985,053 B2
(45) Date of Patent: May 29, 2018

(54) ARRAY SUBSTRATE

(71) Applicant: Samsung Display Co., Ltd., Yongin-si (KR)

(72) Inventors: Kyungho Kim, Yongin-si (KR); Donghyeon Ki, Yongin-si (KR); Kiwon Park, Yongin-si (KR); Donghee Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/054,884

(22) Filed: Feb. 26, 2016

(65) Prior Publication Data
US 2017/0047347 A1    Feb. 16, 2017

(30) Foreign Application Priority Data
Aug. 13, 2015 (KR) .................. 10-2015-0114552

(51) Int. Cl.
  *H01L 29/04* (2006.01)
  *H01L 27/12* (2006.01)

(52) U.S. Cl.
  CPC ........ *H01L 27/124* (2013.01); *H01L 27/1248* (2013.01)

(58) Field of Classification Search
  None
  See application file for complete search history.

(56) References Cited

U.S. PATENT DOCUMENTS

| | | | |
|---|---|---|---|
| 7,514,713 B2 | 4/2009 | Tsai et al. | |
| 2007/0182909 A1 | 8/2007 | Kim et al. | |
| 2010/0000765 A1* | 1/2010 | Hirakata | G02F 1/1309 174/250 |
| 2014/0009714 A1* | 1/2014 | Shim | G02F 1/1333 349/43 |
| 2015/0009438 A1 | 1/2015 | Du et al. | |
| 2015/0108480 A1 | 4/2015 | Xu et al. | |

FOREIGN PATENT DOCUMENTS

KR    10-2007-0080051    8/2007

* cited by examiner

*Primary Examiner* — Hung Vu
(74) *Attorney, Agent, or Firm* — H.C. Park & Associates, PLC

(57) ABSTRACT

An array substrate and a display apparatus including the array substrate. The array substrate includes: a plurality of signal lines aligned in a display area of the array substrate; a plurality of signal pads aligned in a non-display area of the array substrate; a plurality of fan-out lines aligned in the non-display area and respectively connected to the signal lines and the signal pads; a plurality of auxiliary lines respectively overlapping and insulated from the fan-out lines; and a plurality of connection lines connecting in parallel at least two of the auxiliary lines that are adjacent to each other.

20 Claims, 12 Drawing Sheets

US 9,985,053 B2

ARRAY SUBSTRATE

CROSS-REFERENCE TO RELATED APPLICATION

This application claims priority from and the benefit of Korean Patent Application No. 10-2015-0114552, filed on Aug. 13, 2015, which is hereby incorporated by reference for all purposes as if fully set forth herein.

BACKGROUND

Field

Exemplary embodiments relate to an array substrate and a display apparatus including the array substrate.

Discussion of the Background

A flat panel display apparatus includes two substrates and image display elements such as liquid crystals, light-emitting devices, and electrophoretic particles arranged between the substrates.

An array substrate, which is one of the two substrates, has a display area and a peripheral area arranged around the display area. In the display area, signal lines, including gate lines and data lines, and pixel electrodes are aligned in a matrix form.

End portions of the signal lines extend toward the peripheral area to be connected to other layers or external driving circuits, and the signal lines may include fan-out portions where spaces between the end portions of the signal lines narrow. When the fan-out portions are cut, a gate voltage and/or a data voltage may not be applied to each pixel in the display area, such that a display apparatus may malfunction.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus of which pixels in a display area may display an image even though fan-out portions in a peripheral area are cut, and an array substrate included in the display apparatus.

Additional aspects will be set forth in the detailed description which follows, and, in part, will be apparent from the disclosure, or may be learned by practice of the inventive concept.

An exemplary embodiment discloses an array substrate including: a plurality of signal lines aligned in a display area of the array substrate; a plurality of signal pads aligned in a non-display area of the array substrate; a plurality of fan-out lines aligned in the non-display area and respectively connected to the signal lines and the signal pads; a plurality of auxiliary lines respectively overlapping and insulated from the fan-out lines; and a plurality of connection lines connecting in parallel at least two of the auxiliary lines that are adjacent to each other.

An exemplary embodiment also discloses an array substrate including: a plurality of signal lines aligned in a display area of the array substrate; a plurality of signal pads aligned in a non-display area of the array substrate; a plurality of fan-out lines aligned in the non-display area and respectively connected to the signal lines and the signal pads; a plurality of auxiliary lines respectively overlapping the fan-out lines, at least one end of each of auxiliary lines being electrically connected to a corresponding one of the fan-out lines; and a plurality of connection lines connecting in parallel at least two of the auxiliary lines that are adjacent to each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
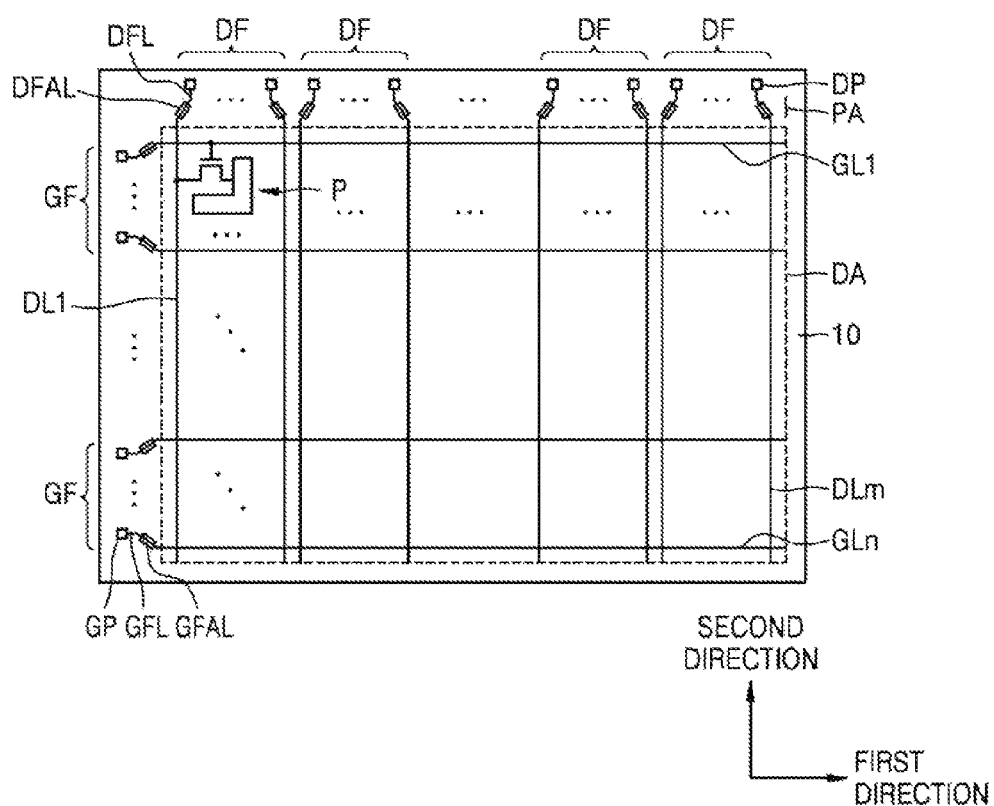
FIG. 1 illustrates a plan view of an array substrate according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
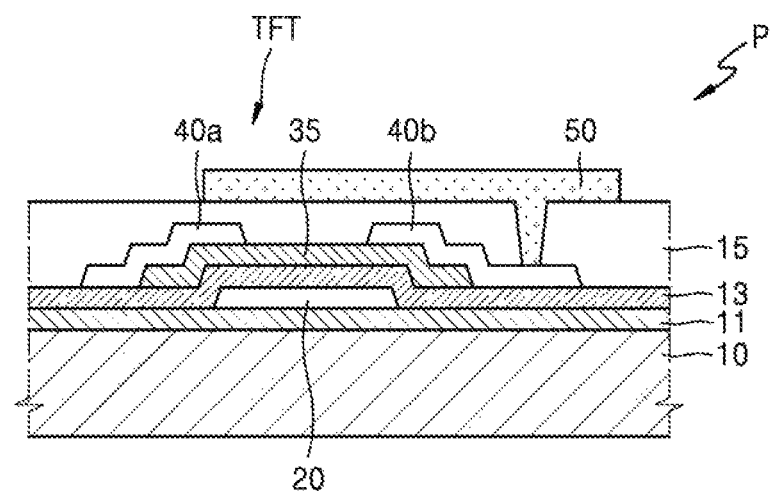
FIG. 2 illustrates a cross-sectional view of a pixel of FIG. 1.

FIG. 1 illustrates a plan view of an array substrate 10 according to an exemplary embodiment. FIG. 2 illustrates a cross-sectional view of a pixel P of FIG. 1.

Referring to FIG. 1, the array substrate 10 (hereinafter, "substrate") may include a display area DA where an image is displayed, and a non-display area, such as a peripheral area PA disposed around the display area DA.

In the display area DA, gate lines GL1 to GLn extending in a first direction, data lines DL1 to DLm extending in a second direction crossing the first direction, and pixels P electrically connected to the gate lines GL1 to GLn and data lines DL1 to DLm are formed.

Referring to FIGS. 1 and 2, the pixel P may include a thin film transistor TFT and a pixel electrode 50. The thin film transistor TFT may include a gate electrode 20 formed above the substrate 10, an active layer 35 formed above the gate electrode 20, and source and drain electrodes 40a and 40b formed above the active layer 35. An ohmic contact layer (not illustrated) may be further formed between the active layer 35 and the source and drain electrodes 40a and 40b.

A first insulating layer 13 is formed between the gate electrode 20 and the active layer 35, and a second insulating layer 15 may be formed between the source and drain electrodes 40a and 40b and the pixel electrode 50. The gate electrode 20 may be connected to its corresponding gate line among the gate lines GL1 to GLn. The source electrode 40a may be connected to its corresponding data line among the data lines DL1 to DLm. The drain electrode 40b may be connected to the pixel electrode 50.

Data fan-out portions DF and gate fan-out portions GF are included in the peripheral area PA.

Each of the data fan-out portions DF includes data fan-out lines DFL. One end of each data fan-out line DFL is electrically connected to its corresponding data pad DP, and the other end of the data fan-out line DFL is electrically connected to its corresponding data line DL. The data pad DP may be electrically connected to an external device, such as a driving integrated circuit. For example, the driving integrated circuit, including a data driving unit, is bonded to the data pads DP in a chip-on-glass (COG) manner, and may be mounted in the peripheral area PA of the substrate 10.

Each gate fan-out portion GF includes gate fan-out lines GFL. One end of each gate fan-out line GFL is electrically connected to its corresponding gate pad GP, and the other end of the gate fan-out line GFL is electrically connected to its corresponding gate line GL. The gate pad GP may be electrically connected to an external device such as a driving integrated circuit. For example, a driving integrated circuit, including a gate driving unit, is bonded to the gate pads GP in a COG manner, and may be mounted in the peripheral area PA of the substrate 10.

Spaces between the data fan-out lines DFL of each data fan-out portion DF decrease from the data line DL toward the data pad DP. First auxiliary lines DFAL that overlap, and are insulated from, the data fan-out lines DFL are formed above the data fan-out lines DFL.

Spaces between the gate fan-out lines GFL of each gate fan-out portion GF decrease from the gate line GL toward the gate pad GP. Second auxiliary lines GFAL that overlap and are insulated from the gate fan-out lines GFL are formed above the gate fan-out lines GFL.

The data fan-out lines DFL and the gate fan-out lines GFL may be formed of the same material and on the same level (e.g., the same layer) as the gate lines GL1 to GLn. The first auxiliary lines DFAL and the second auxiliary lines GFAL may be formed of the same material and on the same level (e.g., the same layer) as the data lines DL1 to DLm.

Hereinafter, because the gate fan-out portion GF and the data fan-out portion DF have similar structures, one or more exemplary embodiment will be described in more detail with reference to the data fan-out portion DF.

Figure 3:
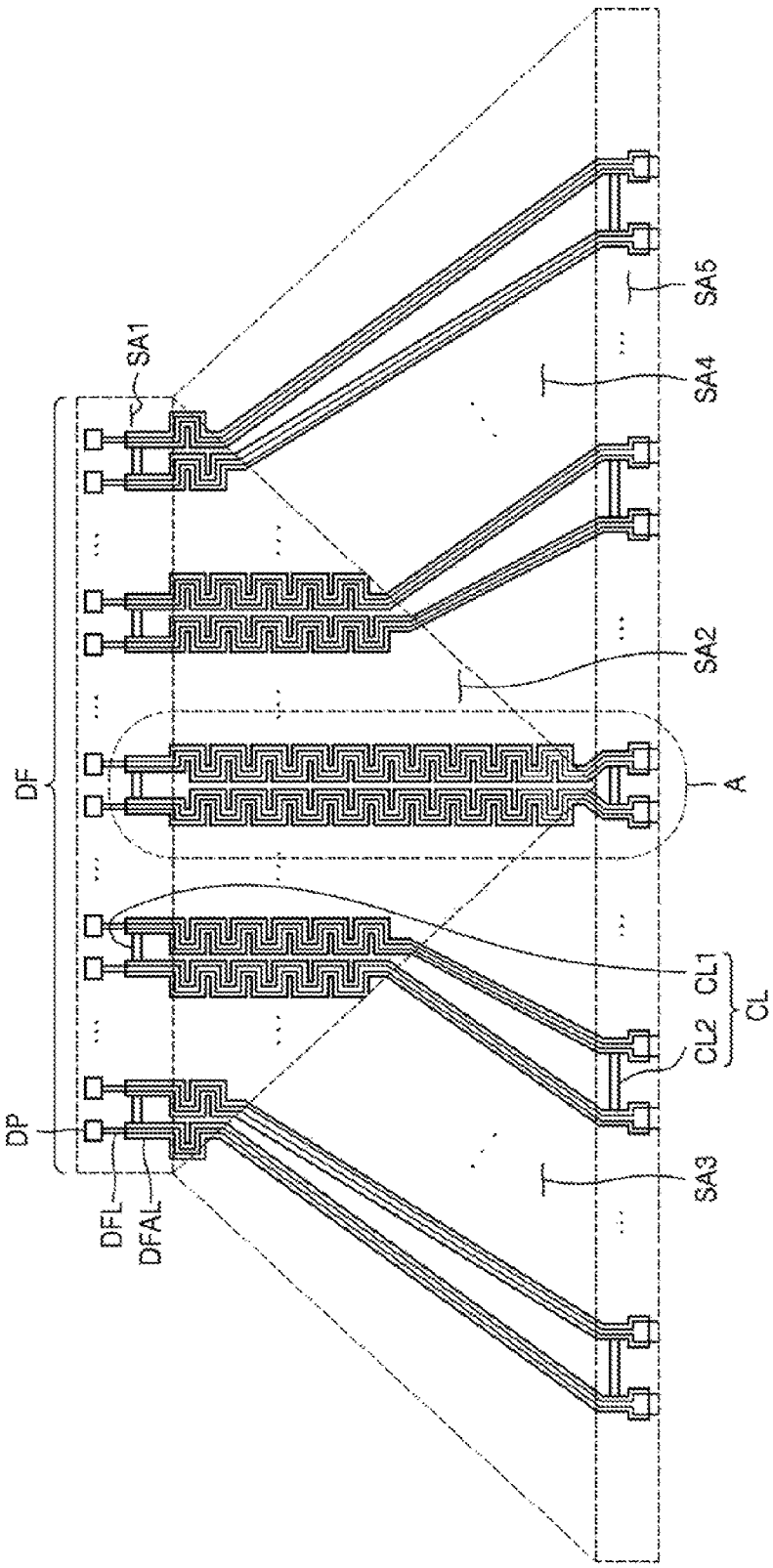
FIG. 3 illustrates an enlarged plan view of a data fan-out portion according to an exemplary embodiment.

FIG. 3 illustrates an enlarged plan view of the data fan-out portion DF according to an exemplary embodiment.

Referring to FIG. 3, the data fan-out lines DFL are aligned in the data fan-out portion DF. One end of the data fan-out line DFL is connected to the data pad DP, and the other end thereof is connected to its corresponding data line DL. Each data fan-out line DFL transmits a data signal to its corresponding data line DL connected thereto.

The data fan-out lines DFL are spaced apart from each other in a data fan-out area. The data fan-out area includes a pad area SA1, a pattern area SA2, slanted areas SA3 and SA4, and a contact area SA5. In the pad area SA1, data pads DP are arranged, and a driving integrated circuit including a data driving unit is mounted. The pattern area SA2 and the slanted areas SA3 and SA4 are located between the pad area SA1 and the contact area SA5. The slanted areas SA3 and SA4 have triangular shapes and are adjacent to each other. The pattern area SA2 is defined by the pad area SA1 and the slanted areas SA3 and SA4, and has a shape of an inverted triangle. The contact area SA5 is located under the pad area SA1, the pattern area SA2, and the slanted areas SA3 and SA4, and is adjacent to the display area DA.

The data fan-out lines DFL are respectively connected to the data pads DP in the pad area SA1, and have straight line shapes, and spaces between the data fan-out lines DFL are substantially constant.

The data fan-out lines DFL extend toward the pattern area SA2 from the pad area SA1. In the pattern area SA2, spaces between the data fan-out lines DFL are substantially constant, and the data fan-out lines DFL have a zigzag pattern. Spaces between the data pads DP are less than those of the data lines DL in the display area DA. Thus, lengths of the data fan-out line DFL connecting the data pads DP and the data lines DL to each other are not constant and, therefore, an RC deviation between the data fan-out lines DFL may be produced. In one or more exemplary embodiments, the data fan-out lines DFL have the zigzag pattern in order to minimize a length deviation of the data fan-out lines DFL. As the number of zigzag patterns increases from the edge of the pattern area SA2 toward the center thereof, the RC deviation between the data fan-out lines DFL may be compensated for.

The data fan-out lines DFL extend toward the slanted areas SA3 and SA4 from the pattern area SA2. The data fan-out lines DFL extending in a diagonal direction in the slanted areas SA3 and SA4 are spaced apart from each other and have straight line shapes. In the slanted areas SA3 and SA4, spaces between the data fan-out lines DFL increase toward the data line DL.

The data fan-out lines DFL extend to the contact area SA5 from the slanted areas SA3 and SA4. Although not illustrated, the data fan-out lines DFL are respectively connected to the data lines DL in the contact area SA5. The data fan-out lines DFL are formed at the same level (e.g. same layer) as the gate line GL, and the data line DL is formed above the gate line GL by interposing an insulating film therebetween. Therefore, a bridge electrode BE of FIG. 4 electrically connecting each data fan-out line DFL to the data line DL is included in the contact area SA5 of the data fan-out area.

The first auxiliary lines DFAL above the data fan-out lines DFL overlap the data fan-out lines DFL in the same shape as the data fan-out lines DFL. The first auxiliary lines DFAL are insulated from the data fan-out lines DFL in a floating state. A width of the first auxiliary line DFAL may be the same as, or greater than, that of the data fan-out line DFL. One end of the first auxiliary lines DFAL is located in the pad area SA1, and the other end thereof is located in the contact area SA5. Two adjacent first auxiliary lines DFAL are connected in parallel to each other by a connection line CL. That is, ends of the two adjacent first auxiliary lines DFAL are connected to a first connection line CL1, and other ends thereof are connected to a second connection line CL2. The first connection line CL1 and the second connection line CL2 may be integrally formed with the first auxiliary lines DFAL or may be electrically connected to the first auxiliary lines DFAL after being formed to be separated from the first auxiliary lines DFAL.

When the first auxiliary lines DFAL are aligned without including the first connection line CL1 and the second connection line CL2, although the first auxiliary line DFAL is electrically connected to its corresponding data fan-out line DFL that is cut, dim-type vertical lines may be created on a screen due to a difference in metal resistivity between the data fan-out line DFL and the first auxiliary line DFAL. In one or more exemplary embodiments, two adjacent first auxiliary lines DFAL are connected to each other in parallel by the first and second connection lines CL1 and CL2. Accordingly, although the cut data fan-out line DFL is repaired by the first auxiliary line DFAL, a difference between a maximum resistance and a minimum resistance of the data fan-out lines DFL may be reduced.

Figure 4:
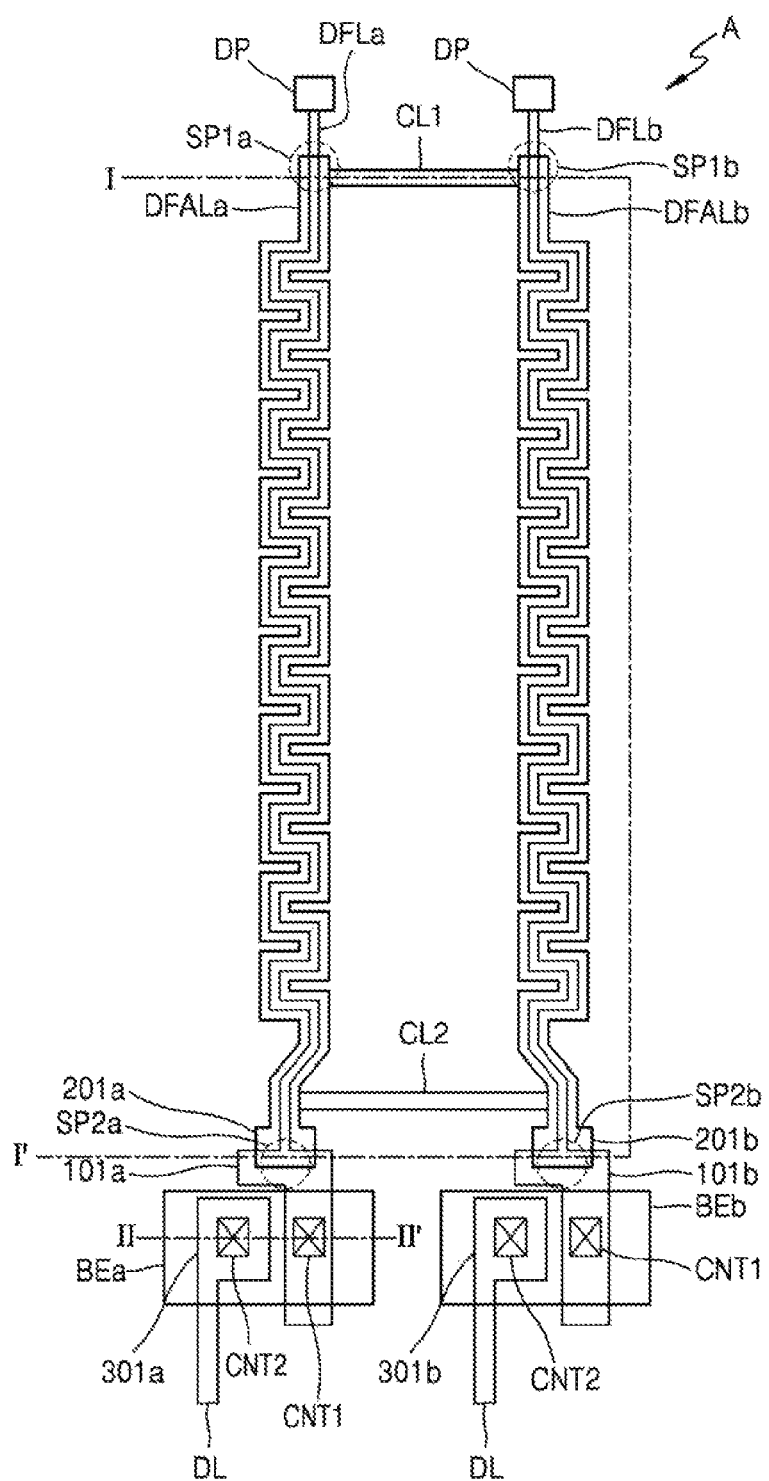
FIG. 4 illustrates an enlarged plan view of an area A of FIG. 3.

FIG. 4 illustrates an enlarged plan view of an area A of FIG. 3.

FIG. 4 illustrates two adjacent data fan-out lines DFL, that is, a left data fan-out line DFLa and a right data fan-out line DFLb.

The first auxiliary lines, that is, a left first auxiliary line DFALa and a right first auxiliary line DFALb, are respectively aligned above the left data fan-out line DFLa and the right data fan-out line DFLb, and respectively correspond thereto. The description provided with reference to FIG. 4 may also apply to another pair of the data fan-out lines DFL and the first auxiliary lines DFAL of FIG. 3.

One end of the left data fan-out line DFLa is connected to the data pad DP, and the other end thereof has a greater width than the one end due to an expansion portion 101a. The left first auxiliary line DFALa extends along a shape of the left data fan-out line DFLa and has a shorter length and a greater width than that of the left data fan-out line DFLa. An area where one end of the left first auxiliary line DFALa overlaps the left data fan-out line DFLa is referred to as a "first short-circuit point SP1a". The other end of the left first auxiliary line DFALa has a greater width than that of the one end thereof due to an expansion portion 201a, and overlaps at least a portion of the expansion portion 101a of the left data fan-out line DFLa. An area where the expansion portion 201a of the left first auxiliary line DFALa overlaps the expansion portion 101a of the left data fan-out line DFLa is referred to as a "second short-circuit point SP2a". The left first auxiliary line DFALa and the left data fan-out line DFLa may be electrically connected to each other at the first short-circuit point SP1a and the second short-circuit point SP2a by irradiation of laser beams or the like.

A bridge electrode BEa is arranged above the expansion portion 101a of the left data fan-out line DFLa and an expansion portion 301a of the data line DL corresponding to the left data fan-out line DFLa, and overlap the same. The expansion portion 101a of the other end of the left data fan-out line DFLa is electrically connected to the bridge electrode BEa through a first contact portion CNT1, and the bridge electrode BEa is electrically connected to the expansion portion 301a of the data line DL through a second contact portion CNT2.

One end of the left first auxiliary line DFALa is connected to one end of the right first auxiliary line DFALb by the first connection line CL1. The other end of the left first auxiliary line DFALa is connected to the other end of the right first auxiliary line DFALb by the second connection line CL2. Accordingly, two adjacent first auxiliary lines, namely, the first and second auxiliary lines DFALa and DFALb, are connected to be in parallel with each other.

Similar to the left data fan-out line DFLa, one end of the right data fan-out line DFLb is connected to the data pad DP, and the other end thereof has a greater width due to an expansion portion 101b. The right first auxiliary line DFALb extends along a shape of the right data fan-out line DFLb, and has a shorter length and a greater width than that of the right data fan-out line DFLb. An area where the one end of the right first auxiliary line DFALb overlaps the right data fan-out line DFLb is referred to as a "first short-circuit point SP1b". The other end of the right first auxiliary line DFALb has a greater width due to an expansion portion 201b, and overlaps at least a portion of the expansion portion 101b of the right data fan-out line DFLb. An area where the expansion portion 201b of the right first auxiliary line DFALb overlaps the expansion portion 101b of the right data fan-out line DFLb is referred to as a "second short-circuit point SP2b". The right first auxiliary line DFALb and the right data fan-out line DFLb may be electrically connected to each other at the first short-circuit point SP1b and the second short-circuit point SP2b by irradiation of laser beams or the like.

A bridge electrode BEb is arranged above the expansion portion 101b of the right data fan-out line DFLb and an expansion portion 301b of the data line DL corresponding to the right data fan-out line DFLb, and overlaps the same. The expansion portion 101b of the other end of the right data fan-out line DFLb is electrically connected to the bridge electrode BEb through the first contact portion CNT1, and the bridge electrode BEb is electrically connected to the expansion portion 301b of the data line DL through the second contact portion CNT2.

FIGS. 3 and 4 illustrate a structure in which two adjacent auxiliary lines are connected in parallel, but the inventive concept is not limited thereto. For example, two or more adjacent auxiliary lines may be connected in parallel.

Figure 5A:
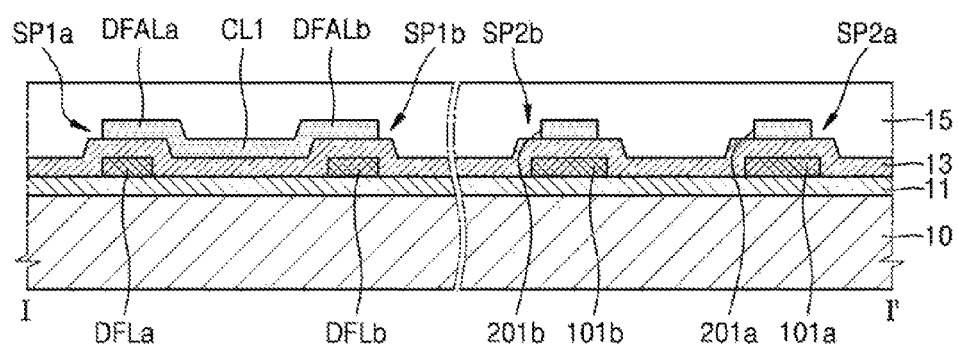
FIG. 5A illustrates a cross-sectional view taken along a line I-I' of FIG. 4.
Figure 5B:
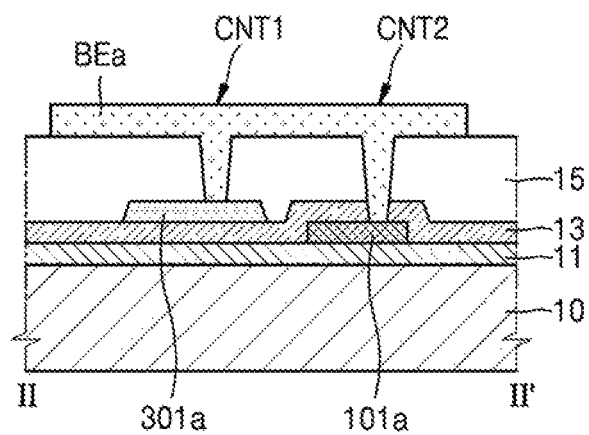
FIG. 5B illustrates a cross-sectional view taken along a line II-II' of FIG. 4.
Figure 6:
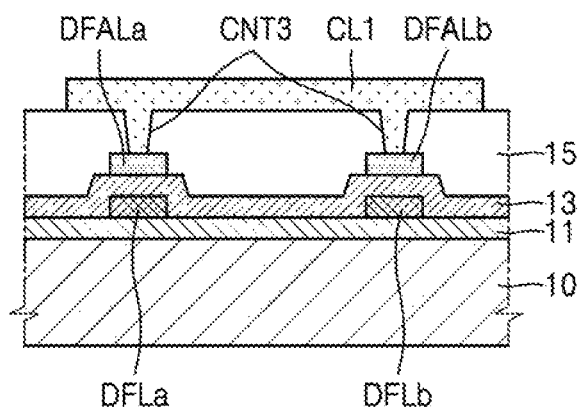
FIG. 6 illustrates another example of a connection line arrangement of FIG. 4.

FIG. 5A illustrates a cross-sectional view taken along a line I-I' of FIG. 4, and FIG. 5B illustrates a cross-sectional view taken along a line II-II' of FIG. 4. FIG. 6 illustrates another example of a connection line arrangement of FIG. 4.

Referring to FIG. 5A, the left and right data fan-out lines DFLa and DFLb are aligned on a buffer layer 11 of the substrate 10. At least a portion of the expansion portions 201a and 201b of the left and right first auxiliary lines DFALa and DFALb ovlerap the expansion portions 101a and 101b of the left and right data fan-out lines DFLa and DFLb.

The left data fan-out line DFLa and the left first auxiliary line DFALa vertically overlap each other in the left first short-circuit point SP1a. The expansion portion 101a of the left data fan-out line DFLa and the expansion portion 201a of the left first auxiliary line DFALa vertically overlap each other in the left second short-circuit point SP2a.

The right data fan-out line DFLb and the right first auxiliary line DFALb vertically overlap each other in the right first short-circuit point SP1b. The expansion portion 101b of the right data fan-out line DFLb and the expansion portion 201b of the right first auxiliary line DFALb vertically overlap each other in the right second short-circuit point SP2b.

The substrate 10 may include glass, plastic, or the like. The buffer layer 11 is further included on the substrate 10 and thus prevents penetration of impurities through the substrate 10 and flattens a surface of the substrate 10. The buffer layer 11 may be a single layer or layers including an inorganic material such as silicon nitride ($SiN_x$) and/or silicon oxide ($SiO_x$).

The left and right data fan-out lines DFLa and DFLb may include an aluminum-based metal such as aluminum (Al) or an Al alloy, a silver-based metal such as silver (Ag) and an Ag alloy, a copper-based metal such as copper (Cu) and a Cu alloy, a molybdenum-based metal such as molybdenum (Mo) and a Mo alloy, chromium (Cr), titanium (Ti), tantalum (Ta), or the like.

A first insulating layer 13 is disposed on the left and right data fan-out lines DFLa and DFLb. The first insulating layer 13 may be a single inorganic insulating layer, or inorganic insulating layers, including $SiN_x$, $SiO_x$, and the like.

The left and right first auxiliary lines DFALa and DFALb are disposed on the first insulating layer 13. The left and right first auxiliary lines DFALa and DFALb that are adjacent to each other are connected in parallel by the first and second connection lines CL1 and CL2. The first and second connection lines CL1 and CL2 may be integrally formed with the left and right first auxiliary lines DFALa and DFALb. FIG. 5A only illustrates the first connection line CL1, but the second connection line CL2 may be arranged in a manner similar to that of the first connection line CL1.

As another exemplary embodiment illustrated in FIG. 6, the first and second connection lines CL1 and CL2 may be arranged on layers different from the left and right first auxiliary lines DFALa and DFALb, that is, above the left and right first auxiliary lines DFALa and DFALb. The first and second connection lines CL1 and CL2 are electrically connected to the left and right first auxiliary lines DFALa and DFALb by a third contact portion CNT3. The first and second connection lines CL1 and CL2 may be formed of the same material and on the same level (e.g., the same layer) as the bridge electrodes BEa and BEb.

The left and right first auxiliary lines DFALa and DFALb and the first and second connection lines CL1 and CL2 may include an Al-based metal such as Al or an Al alloy, a Ag-based metal such as Ag and an Ag alloy, a Cu-based metal such as Cu and a Cu alloy, a Mo-based metal such as Mo and a Mo alloy, Cr, Ti, Ta, or the like.

A second insulating layer 15 is disposed on the left and right first auxiliary lines DFALa and DFALb as a protection layer. The second insulating layer 15 may have a structure in which one or more organic insulating layers having a good planarization property and photosensitivity, or one or more inorganic insulating layers are stacked or the organic insulating layers or inorganic insulating layers are alternately stacked.

The data lines DL are aligned at the same level (e.g., in the same layer) as the left and right first auxiliary lines DFALa and DFALb.

Referring to FIG. 5B, the bridge electrodes BEa and BEb overlap the expansion portions 101a and 101b of the left and right data fan-out lines DFLa and DFLb, and the expansion portions 301a and 301b of the data lines DL and are arranged thereabove. The bridge electrodes BEa and BEb may include the same material at the same level (e.g., in same layer) as the pixel electrodes 50 (of FIG. 2). The bridge electrodes BEa and BEb may include ITO or IZO. The bridge electrodes BEa and BEb may be electrically connected to the expansion portions 101a and 101b of the left and right data fan-out lines DFLa and DFLb through the first contact portion CNT1. The bridge electrodes BEa and BEb are electrically connected to the expansion portions 301a and 301b of the data lines DL through the second contact portion CNT2. That is, the left and right data fan-out lines DFLa and DFLb are electrically connected to their corresponding data lines DL through the bridge electrodes BEa and BEb. FIG. 5B only illustrates the expansion portion 101a of the left data fan-out line DFLa, the expansion portion 301a of the left data line DL, and the left bridge electrode BEa. However, the expansion portion 101b of the right data fan-out line DFLb, the expansion portion 301b of the right data line DL, and the right bridge electrode BEb may be arranged in the same manner as illustrated in FIG. 5B.

Figure 7:
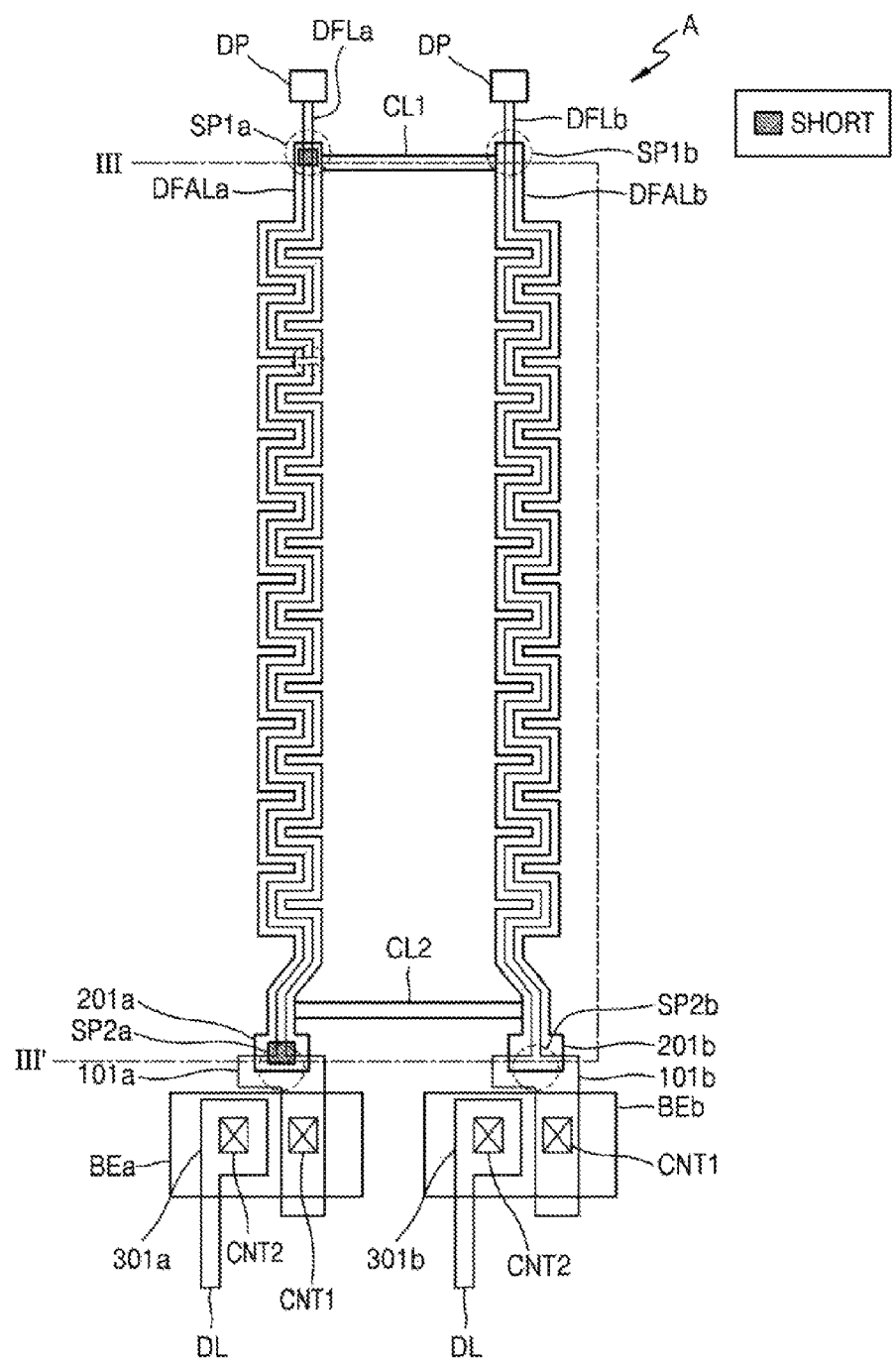
FIG. 7 illustrates a plan view of a case of a repaired left data fan-out line, according to an exemplary embodiment.
Figure 8:
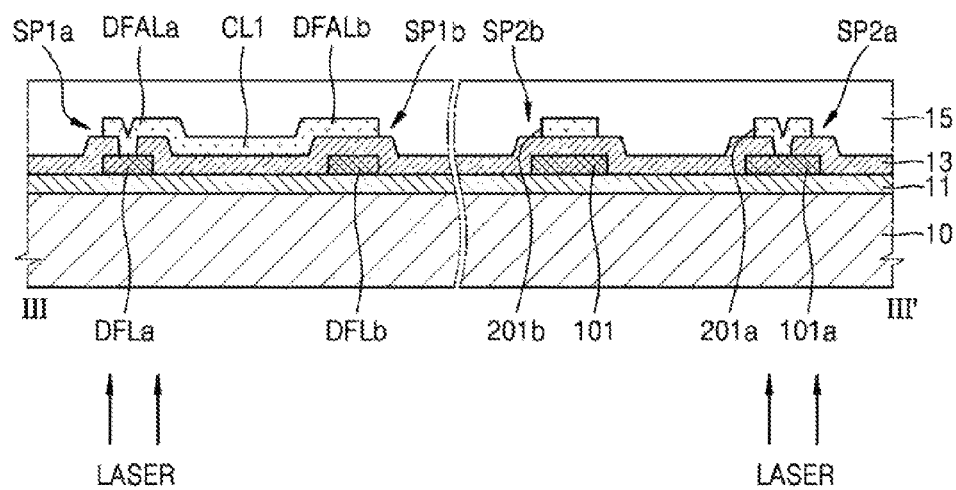
FIG. 8 illustrates a cross-sectional view taken along a line III-III' of FIG. 7.

FIG. 7 illustrates a plan view of a case where the left data fan-out line DFLa is repaired, according to an exemplary embodiment. FIG. 8 illustrates a cross-sectional view taken along a line III-III' of FIG. 7.

When the left data fan-out line DFLa has a short-circuit problem due to impurities, the left data fan-out line DFLa is repaired by the left first auxiliary line DFALa. When a laser beam is irradiated onto the first short-circuit point SP1a and the second short-circuit point SP2a on the left side, insulating layers between both first and second ends of the left data fan-out line DFLa and the left first auxiliary line DFALa break. Thus, the first and second ends of the left data fan-out line DFLa and the left first auxiliary line DFALa are respectively short-circuited, and may be electrically connected. The irradiation of a laser beam or the like may be performed in a direction toward the substrate 10 or an opposite direction.

The left first auxiliary line DFALa is connected to the right first auxiliary line DFALb, but the laser beam is not irradiated onto the first short-circuit point SP1b and the second short-circuit point SP2b on the right side. That is, a short-circuit repair is performed only in data fan-out lines having a short-circuit.

A steam pressure may be generated at the first short-circuit point SP1a and SP1b and the second short-circuit point SP2a and SP2b while the laser beam is irradiated. Accordingly, when a sealing substrate is pressed at the second short-circuit point SP2a and SP2b, a pressure short-circuit may be created between an electrode layer of the sealing substrate and an auxiliary line of the substrate 10.

In one or more exemplary embodiments, an insulating pattern for preventing a short-circuit may be included on the auxiliary lines in order to prevent a short-circuit between pressed upper and lower substrates.

Figure 9:
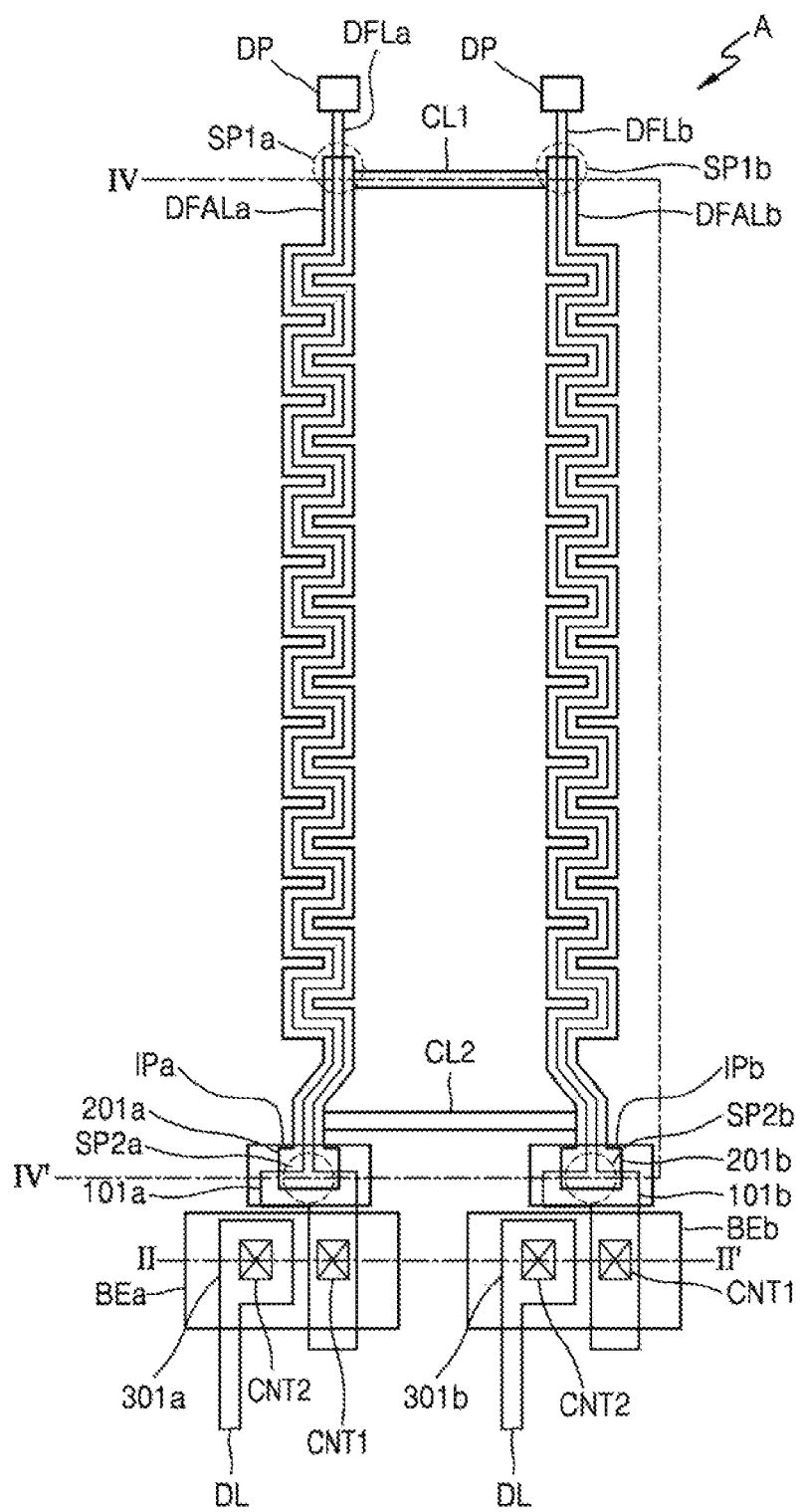
FIG. 9 illustrates another example of the enlarged plan view of the area A of FIG. 3.
Figure 10:
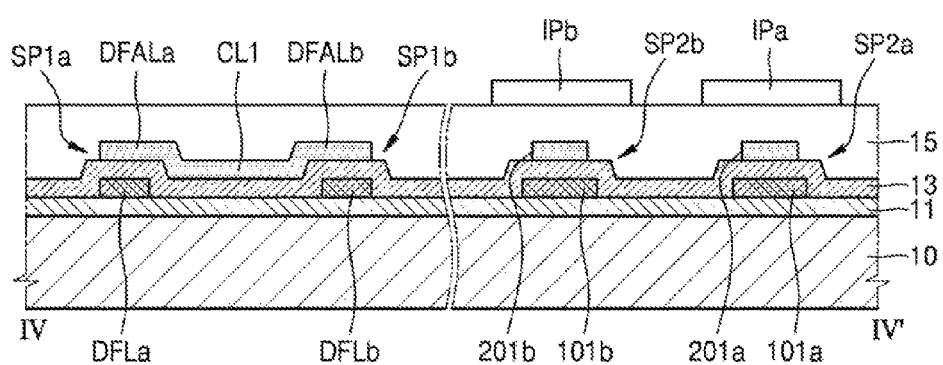
FIGS. 10 and 11 illustrate cross-sectional views taken along a line IV-IV' of FIG. 9.
Figure 11:
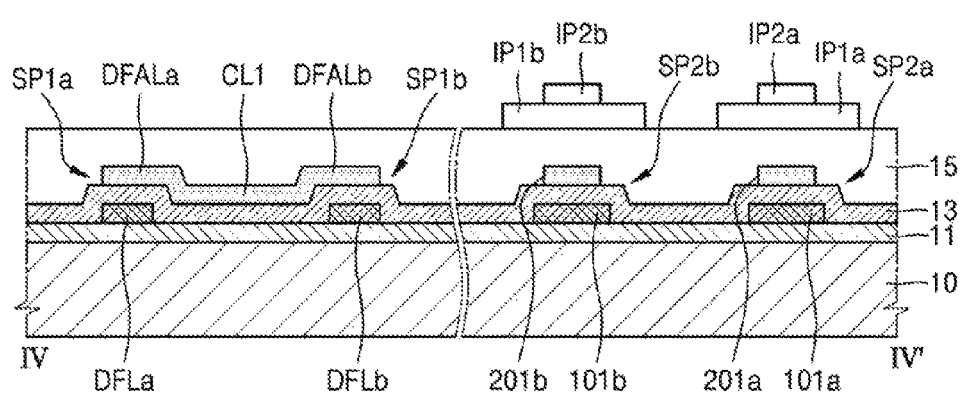

FIG. 9 illustrates another example of the enlarged plan view of the area A of FIG. 3, and FIGS. 10 and 11 illustrate cross-sectional views taken along a line IV-IV' of FIG. 9.

At least one insulating pattern may be included on an auxiliary line at at least one of first and second short-circuit points SP1 and SP2. FIG. 9 illustrates an insulating pattern at the second short-circuit point SP2.

Referring to FIGS. 9 and 10, an insulating pattern IPa may be arranged at the second short-circuit point SP2a where the expansion portion 101a of the left data fan-out line DFLa overlaps the expansion portion 201a of the left first auxiliary line DFALa. An insulating pattern IPb may be arranged at the second short-circuit point SP2b where the expansion portion 101b of the right data fan-out line DFLb overlaps the expansion portion 201b of the right first auxiliary line DFALb. The insulating patterns IPa and IPb may include the same material as a material forming a blue color filter. As another exemplary embodiment, the insulating patterns IPa and IPb may include organic materials. The second insulating layer 15 is arranged above the expansion portions 201a and 201b of the left and right first auxiliary lines DFALa and DFALb. The insulating patterns IPa and IPb are arranged above the second insulating layer 15.

Although a repair of a data fan-out line is performed at the second short-circuit points SP2a and SP2b where the sealing substrate is located, a short-circuit that may be caused by the pressing by the sealing substrate may be prevented by the insulating patterns IPa and IPb at the second short-circuit points SP2a and SP2b.

As another exemplary embodiment illustrated in FIG. 11, a first insulating pattern IP1a and a second insulating pattern IP2a may be arranged at the second short-circuit point SP2a where the expansion portion 101a of the left data fan-out line DFLa overlaps the expansion portion 201a of the left first auxiliary line DFALa. A first insulating pattern IP1b and a second insulating pattern IP2b may be arranged at the second short-circuit point SP2b where the expansion portion 101b of the right data fan-out line DFLb overlaps the expansion portion 201b of the right first auxiliary line DFALb. The first insulating patterns IP1a and IP1b may include the same material as a material forming a blue color filter. The second insulating patterns IP2a and IP2b may include organic materials. The second insulating layer 15 is arranged above the expansion portions 201a and 201b of the left and right first auxiliary lines DFALa and DFALb. The first insulating patterns IP1a and IP1b are arranged above the second insulating layer 15 and overlap the expansion portions 201a and 201b of the left and right first auxiliary lines DFALa and DFALb. The second insulating patterns IP2a and IP2b overlap the first insulating patterns IP1a and IP1b and are arranged thereabove. FIG. 11 illustrates that the second insulating patterns IP2a and IP2b overlap the first insulating patterns IP1a and IP1b, but the inventive concept is not limited thereto. For example, the second insulating patterns IP2a and IP2b need not overlap the first insulating patterns IP1a and IP1b and may instead be arranged on the bridge electrodes BE in order to maintain a gap between the upper and lower substrates.

Although a repair of a data fan-out line is performed at the second short-circuit is points SP2a and SP2b where the sealing substrate is located, a short-circuit that may be caused by the pressing by the sealing substrate may be prevented by the first insulating patterns IP1a and IP1b and the second insulating patterns IP2a and IP2b at the second short-circuit points SP2a and SP2b. In the present exemplary embodiment, because the second insulating patterns IP2a and IP2b are further arranged, a step difference at the second short-circuit points SP2a and SP2b is formed, and a gap between the substrate 10 and the sealing substrate is maintained, thereby preventing a short-circuit.

According to the one or more exemplary embodiments of the inventive concept, the data fan-out lines and first auxiliary lines have mainly described, but the descriptions thereof may also be applied to the gate fan-out lines and second auxiliary lines. However, since the gate fan-out lines may be integrally formed with the gate lines, bridge electrodes may not be included in a contact portion of the gate fan-out area.

According to the one or more exemplary embodiments of the inventive concept, the thin film transistor TFT is of a bottom gate type in which a gate electrode is arranged under the active layer, but the inventive concept is not limited thereto. The gate electrode may be arranged above the active layer.

According to the one or more exemplary embodiments of the inventive concept, although fan-out portions in a peripheral area are cut, each pixel properly operates by repairing the fan-out portions, and thus, the yield of an array substrate and a display apparatus may increase.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An array substrate comprising:
a plurality of signal lines aligned in a display area of the array substrate;
a plurality of signal pads aligned in a non-display area of the array substrate;
a plurality of fan-out lines aligned in the non-display area and respectively connected to the signal lines and the signal pads;
a plurality of auxiliary lines respectively overlapping and insulated from the fan-out lines; and
a plurality of connection lines connecting in parallel at least two of the auxiliary lines that are adjacent to each other,
wherein each of the auxiliary lines overlaps and extends along a corresponding one of the fan-out lines.

2. The array substrate of claim 1, wherein the connection lines are integrally formed with the auxiliary lines.

3. The array substrate of claim 1, wherein the connection lines are electrically connected to the auxiliary lines through a contact hole formed in an insulating layer disposed between the connection lines and the auxiliary lines.

4. The array substrate of claim 1, wherein the connection lines comprise:
a first connection line connecting first ends of the auxiliary lines; and
a second line connecting second ends of the auxiliary lines.

5. The array substrate of claim 1, further comprising at least one insulation pattern arranged on at least one of the first and second ends of each of the auxiliary lines.

6. The array substrate of claim 5, wherein the at least one insulation pattern comprises a blue color filter material.

7. The array substrate of claim 1, wherein:
the fan-out lines comprise a first area and a second area; and
the fan-out lines have straight line shapes, spaces between the fan-out lines decrease toward the signal pads from the signal lines in the first area, and the fan-out lines have a zigzag pattern and spaces between the fan-out lines are constant in the second area.

8. The array substrate of claim 7, wherein, in the second area, a length of the zigzag pattern decreases from a center portion of the zigzag pattern to an outer portion of the zigzag pattern.

9. The array substrate of claim 1, wherein the signal lines comprise:
a plurality of gate lines extending in a first direction; and
a plurality of data lines extending in a second direction crossing the first direction.

10. The array substrate of claim 9, wherein:
the fan-out lines are aligned at a same level as the plurality of gate lines; and
the auxiliary lines are aligned at a same level as the data lines.

11. An array substrate comprising:
a plurality of signal lines aligned in a display area of the array substrate;
a plurality of signal pads aligned in a non-display area of the array substrate;
a plurality of fan-out lines aligned in the non-display area and respectively connected to the signal lines and the signal pads;
a plurality of auxiliary lines respectively overlapping the fan-out lines, at least one end of each of the auxiliary lines being electrically connected to a corresponding one of the fan-out lines; and
a plurality of connection lines connecting in parallel at least two of the auxiliary lines that are adjacent to each other,
wherein each of the auxiliary lines overlaps and extends along a corresponding one of the fan-out lines.

12. The array substrate of claim 11, wherein the connection lines are integrally formed with the auxiliary lines.

13. The array substrate of claim 11, wherein the connection lines are electrically connected to the auxiliary lines through a contact hole formed in an insulating layer disposed between the connection lines and the plurality of auxiliary lines.

14. The array substrate of claim 11, wherein the connection lines comprise:
a first connection line connecting first ends of the auxiliary lines; and
a second connection line connecting second ends of the auxiliary lines.

15. The array substrate of claim 11, further comprising at least one insulation pattern arranged on at least one of the first and second ends of each of the auxiliary lines.

16. The array substrate of claim 15, wherein the at least one insulation pattern comprises a blue color filter material.

17. The array substrate of claim 11, wherein:
the fan-out lines comprise a first area and a second area; and
the fan-out lines have straight line shapes, spaces between the fan-out lines decrease toward the signal pads from the signal lines in the first area, and the fan-out lines have a zigzag pattern and spaces between the fan-out lines are constant in the second area.

18. The array substrate of claim 17, wherein, in the second area, a length of the zigzag pattern decreases from a center portion of the zigzag pattern to an outer portion of the zigzag pattern.

19. The array substrate of claim 11, wherein the signal lines comprise:
a plurality of gate lines extending in a first direction; and
a plurality of data lines extending in a second direction crossing the first direction.

20. The array substrate of claim 19, wherein:
the fan-out lines are aligned at a same level as the gate lines, and
the auxiliary lines are aligned at a same level as the data lines.

* * * * *